United States Patent [19]

Herrmann

[11] Patent Number: 5,228,553
[45] Date of Patent: Jul. 20, 1993

[54] DRIVE MECHANISM FOR A CONVEYOR OF A PRINTER CIRCUIT BOARD PROCESSOR

[75] Inventor: John Herrmann, Maple Plane, Minn.

[73] Assignee: Circuit Chemistry Equipment, Inc., Long Lake, Minn.

[21] Appl. No.: 840,446

[22] Filed: Feb. 24, 1992

[51] Int. Cl.⁵ .................................................. B65G 29/00
[52] U.S. Cl. ..................................................... 198/624
[58] Field of Search .................. 198/624; 271/272, 248

[56] References Cited

U.S. PATENT DOCUMENTS

| | | | |
|---|---|---|---|
| 3,068,918 | 12/1962 | Smith | 198/624 X |
| 3,189,162 | 6/1965 | Brundell et al. | 198/624 |
| 3,889,798 | 6/1975 | Jurgens et al. | 198/624 |
| 4,036,705 | 7/1977 | Eidschun, Jr. | |
| 4,064,019 | 12/1977 | Eidschun, Jr. | |
| 4,078,982 | 3/1978 | Eidschun, Jr. | |
| 4,090,938 | 5/1978 | Eidschun, Jr. | |
| 4,119,499 | 10/1978 | Eidschun, Jr. | |
| 4,186,062 | 1/1980 | Eidschun | |
| 4,359,366 | 11/1982 | Eidschun | |
| 4,361,470 | 11/1982 | Eidschun | |
| 4,371,422 | 2/1983 | Eidschun | |
| 4,372,825 | 2/1983 | Eidschun | |
| 4,376,684 | 5/1983 | Eidschun | |
| 4,401,522 | 8/1983 | Buschow et al. | |
| 4,427,019 | 1/1984 | Eidschun | |
| 4,443,304 | 4/1984 | Eidschun | |
| 4,457,515 | 7/1984 | Eidschun | |
| 4,616,971 | 10/1986 | Matrone | |
| 4,640,409 | 2/1987 | Holtman | 198/624 |
| 4,653,794 | 5/1987 | Atlas | |
| 4,666,294 | 5/1987 | Gelbert et al. | |
| 4,739,780 | 4/1988 | Czaja et al. | |
| 4,765,273 | 8/1988 | Anderle | 198/624 X |
| 4,875,670 | 10/1989 | Petersen et al. | 198/624 X |
| 4,903,818 | 2/1990 | Loehr et al. | |
| 4,926,789 | 5/1990 | Wenger et al. | |

FOREIGN PATENT DOCUMENTS

| | | | |
|---|---|---|---|
| 0201720 | 9/1987 | Japan | 198/624 |
| 709908 | 6/1954 | United Kingdom | 198/624 |

Primary Examiner—D. Glenn Dayoan
Attorney, Agent, or Firm—McAndrews, Held & Malloy, Ltd.

[57] ABSTRACT

A drive mechanism for a conveyor of printed circuit board processor includes a first roller mounted for rotation about a first axis and a second roller mounted for rotation about a second axis that is generally parallel to the first axis. The first and second rollers are shaped so that they form a guide groove therebetween when they are disposed adjacent one another. The rollers grip the printed circuit board in the guide groove and assist in supporting the printed circuit board in a vertical orientation. Rotation of the first and second rollers drives the printed circuit board in a horizontal direction through the guide groove and toward the next drive mechanism along the processing path.

13 Claims, 4 Drawing Sheets

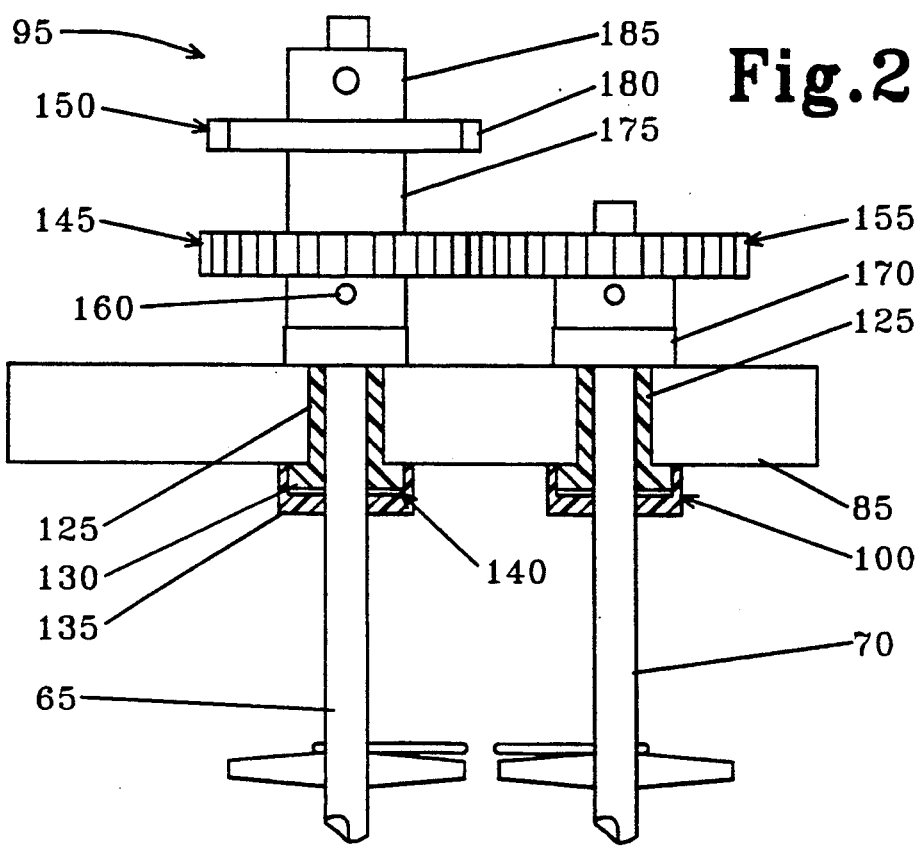
Fig.2
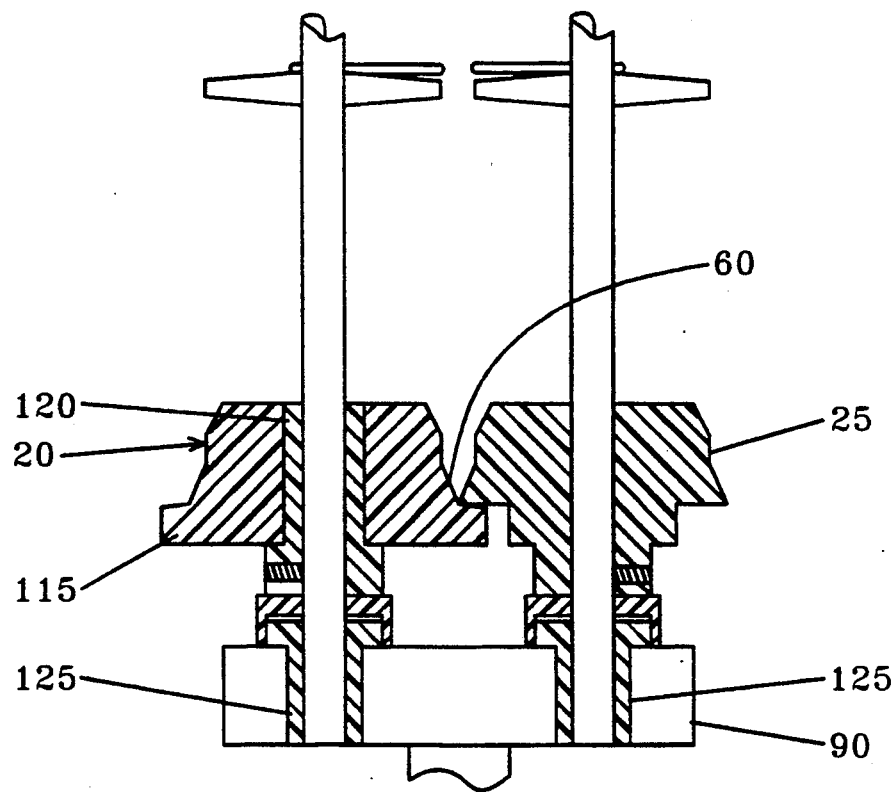

Fig.3
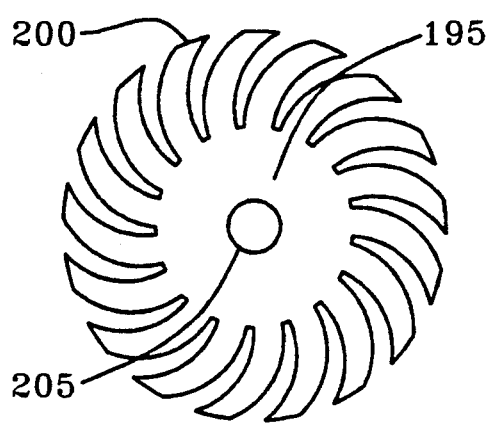
Fig.5
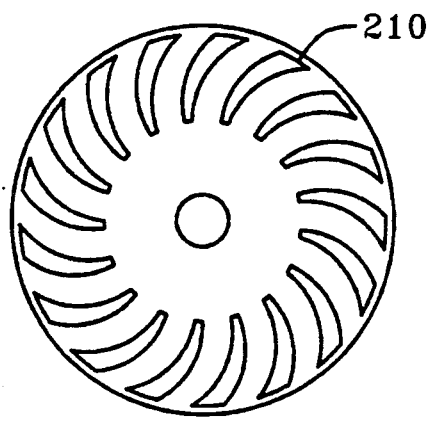
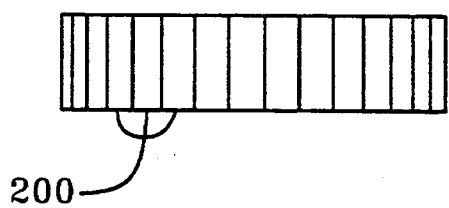
Fig.4
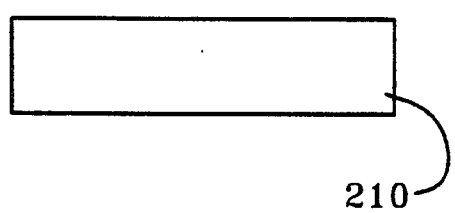
Fig.6
Fig.9          Fig.10

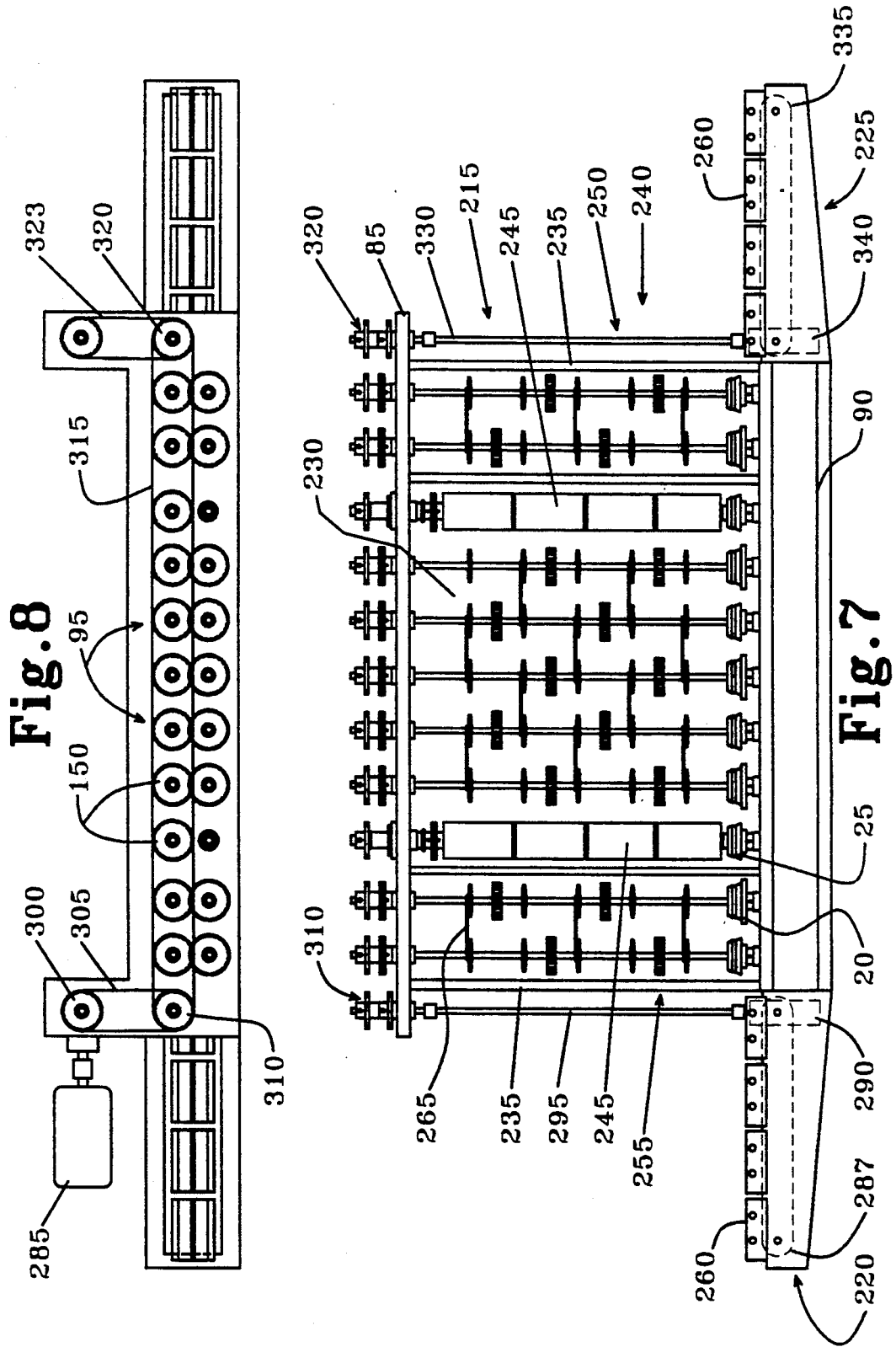

DRIVE MECHANISM FOR A CONVEYOR OF A PRINTER CIRCUIT BOARD PROCESSOR

FIELD OF THE INVENTION

The present invention relates to a machine for processing printed circuit boards. More particularly, the present invention is directed to a drive mechanism for a printed circuit board processing machine.

BACKGROUND OF THE INVENTION

Printed circuit boards are often processed by transporting them through a series of processing chambers. Each chamber is adapted to perform one or more functions including: developing, etching, stripping, cleaning, and rinsing the printed circuit boards. Many of these functions involve applying liquid chemicals evenly over the surface of opposite sides of the printed circuit boards. Since a horizontal orientation of the printed circuit boards may result in "pooling" of these chemicals, it is desirable to process and transport the printed circuit boards in a vertical orientation.

U.S. Pat. No. 4,427,019 to Eidshun is directed to such an apparatus and is specifically designed for the continuous vertical processing of printed circuit boards. The printed circuit boards are gripped and suspended in a vertical orientation by a hanger that is a component of a conveyor system. The conveyor system transports the printed circuit boards through a plurality of chambers having slotted end portions, each chamber being adapted for a particular processing function.

U.S. Pat. No. 4,739,780 to Czaja et al, incorporated herein by reference, is directed to a conveyorized processor system for transporting vertically oriented printed circuit boards. The system includes a geometrically configured printed circuit board holder. The holder includes a plurality of opposing rubber gripper fingers mounted perpendicularly to each other to form a seating area or pocket. The holder mounts on a conveyor chain or the like. Circuit boards rest vertically in a V-shaped area formed by the gripper fingers for carriage through the processing chambers.

In each of the foregoing systems, each printed circuit board is gripped by the conveyor system at a fixed location on the board and is held by a gripping mechanism in that fixed location for the entire time that it is transported through the processing chamber. Consequently, the areas of the printed circuit board that are gripped may be shielded from the processing chemicals by the gripping components. This may lead to an uneven processing of the printed circuit board in the shielded areas.

SUMMARY OF THE INVENTION

A drive mechanism for a conveyor of printed circuit board processor is set forth which avoids the shielding effects inherent in prior art drive mechanisms which grip the board at fixed locations throughout its transport through the processing chamber. In accordance with the invention, the drive mechanism includes a first roller mounted for rotation about a first axis and a second roller mounted for rotation about a second axis that is generally parallel to the first axis. The first and second rollers are shaped so that they form a guide groove therebetween when they are disposed adjacent one another. The rollers grip the printed circuit board in the guide groove and assist in supporting the printed circuit board in a vertical orientation. Rotation of the first and second rollers drives the printed circuit board horizontally through the guide groove and toward the next drive mechanism along the processing path. The printed circuit boards are thus transported along the processing path by gripping the board at varying locations as opposed to a fixed board location. Uneven processing of the boards is reduced since there is no single location which remains shielded by the gripping mechanism.

In one advantageous embodiment of the invention, the first roller includes an annular section having an outwardly slanted outer wall extending obtusely with respect to the vertical. Likewise, the second roller includes an annular shaped portion having an outwardly slanted outer wall extending obtusely with respect to the vertical. Together, the outer walls of the annular shaped portions cooperate to define V-shaped guide groove therebetween.

In a further advantageous embodiment of the invention, the second roller includes a flange portion that extends from its annular shaped portion. The flange frictionally engages a portion of the underside of the first roller.

In a still further advantageous embodiment of the invention, a drive shaft extends respectively through an aperture in each of the drive rollers. The drive shafts are connected to a gear mechanism which is driven by a motor to rotate the drive rollers in a counterotating manner. Annular disks and annular pinch rollers are disposed on the drive shafts to assist the drive rollers in transporting the printed circuit boards through the printed circuit board processor.

BRIEF DESCRIPTION OF THE DRAWINGS

Other objects and features of the present invention may be further understood by reference to the following detailed description of the preferred embodiment of the invention taken in conjunction with the accompanying drawings, on which:

FIG. 2 is a front view of the embodiment of the invention shown in FIG. 1 showing partial cross-sectional views of various portions thereof.

FIG. 3 is a top view of one embodiment of a pinch roller adapted for use in the present invention.

FIG. 4 is a side view of the pinch roller of FIG. 3.

FIG. 5 is a top view of a further embodiment of a pinch roller adapted for use in the present invention. 1

FIG. 6 is a side view of the pinch roller of FIG. 5.

FIG. 7 is a side view of the drive portion of a printed circuit board processor incorporating a plurality of the drive mechanisms shown in FIG. 1.

FIG. 8 is a top view of the drive portion of the printed circuit board processor shown in FIG. 3.

FIGS. 9 and 10 illustrate the guide wires that interconnect the drive shafts of the plurality of drive mechanisms shown in FIG. 7.

Figure 1:
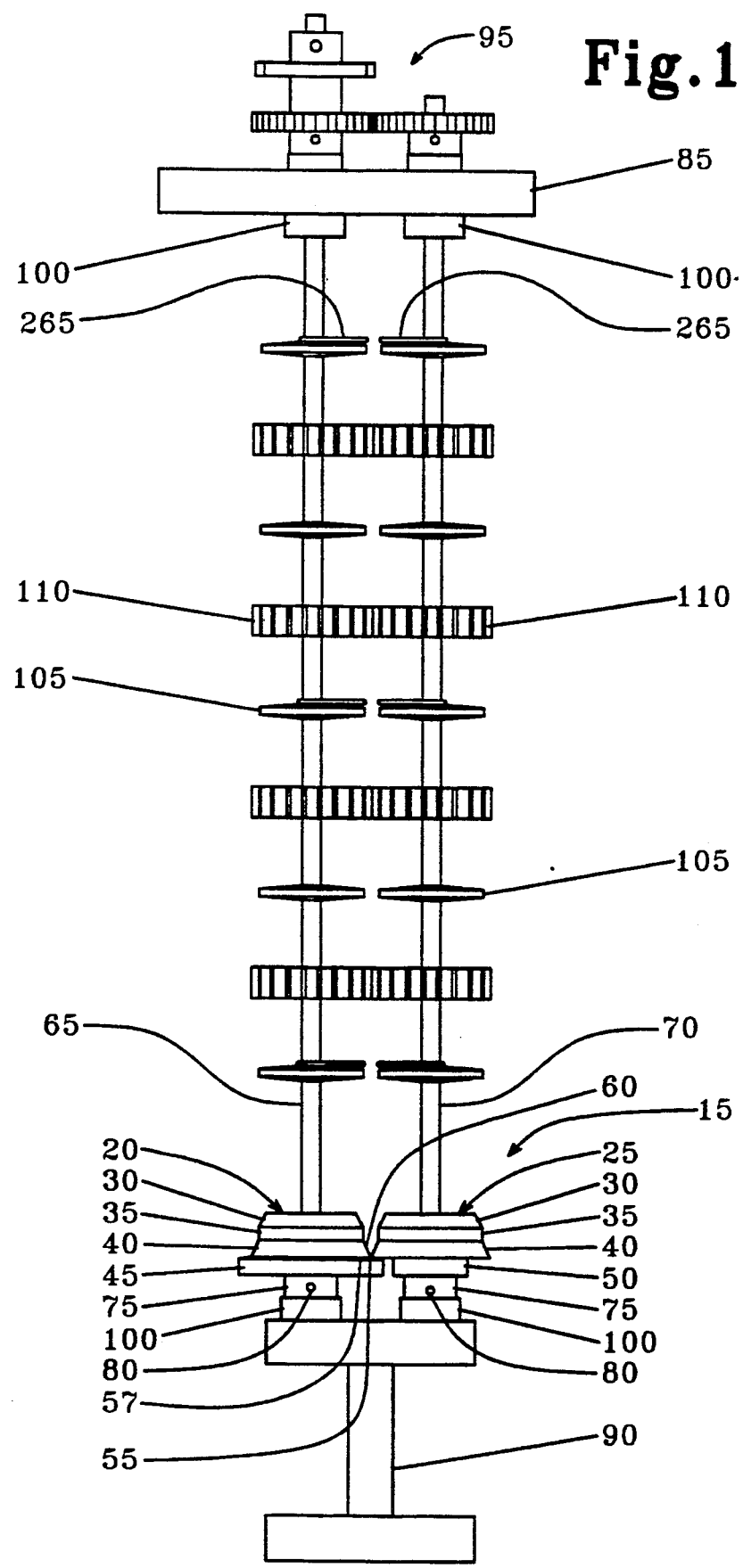
FIG. 1 is a front view of a drive mechanism constructed in accordance with one embodiment of the invention.

It will be understood that the drawings are not necessarily to scale. In certain instances, details which are not necessary for understanding various aspects of the present invention have been omitted for clarity.

DESCRIPTION OF THE PREFERRED EMBODIMENT

FIG. 1 shows a drive mechanism generally denoted at 15. The drive mechanism includes a first annular drive roller 20 and a second annular drive roller 25 disposed adjacent one another. Each drive roller 20, 25 includes a first annular section 30 having a slanted outer wall, a second annular section 35 having an outer wall that is generally vertical, and a third annular section 40 having an outer wall that is slanted outwardly at an obtuse angle with respect to the generally vertical outer wall of the second annular section 35.

As illustrated, the first drive roller 20 further includes a flange 45 that extends radially outward from the drive roller. The corresponding portion of the second drive roller is formed as a collar 50 having a smaller diameter than the third annular section 40 of the second drive roller 25. The edge 55 of the second drive roller 25 overlaps and frictionally engages a portion of the upper beveled surface 57 of the flange 45 and third annular section 40. Although not shown in the illustrated embodiment, the side portion of the flange 45 of the first drive roller 20 and the side portion of the collar 50 of the second drive roller 25 can likewise, or in the alternative, form frictionally engaging surfaces. The frictional forces may, if desired, be used to link the first and second drive rollers 20, 25 so that rotation of one drive roller produces a corresponding counterrotation of the other drive roller.

The first and second drive rollers cooperate to define a guide groove 60. The guide groove has a first partially defined V-shaped section formed by the slanted outer walls of the first annular sections 30. A second, more fully defined V-shaped section of the guide groove 60 is formed by the slanted outer walls of the third annular sections 40. Although the invention has been illustrated using a particular guide groove shape, those of ordinary skill in the art will recognize that other guide groove shapes are feasible.

Each drive roller 20 and 25 includes a centrally disposed aperture that accepts a respective drive shaft 65 and 70. Each drive roller further includes a collar 75 having a set screw 80 disposed therethrough which secures the drive roller to its respective drive shaft.

As illustrated, the drive shafts 65 and 70 extend between top and bottom support members 85 and 90. The upper portions of the drive shafts 65 and 70 extend through the top support member 85 to engage a gear mechanism, shown generally at 95. Each end of each drive shaft engages a renewable seal cartridge 100. Molded elastomer discs 105 and pinch rollers 110 are distributed along the length of the drive shafts 65 and 70.

FIG. 2 is a partial cross-sectional view illustrating further details of the drive rollers 20 and 25, gear mechanism 95, and seal cartridges 100. As shown, the first drive roller 20 is comprised of two joined parts. A sleeve portion 115 formed from EPDM, is slipped over a core member 120 formed from PVC. The second drive roller 25, on the other hand, is a unitary structure that is formed from PVC.

The seal cartridges 100 extend into apertures 125 disposed through the top and bottom support members 85 and 90. Each seal cartridge 100 includes a bushing 130 that is preferably formed from UHMW (ultra high molecular weight polyethylene), an outer cap portion 135 that is formed from PVC, and a gasket 140 that is formed from EDPM or from one of a variety of fluoro elastomers such as those that are commercially available from DuPont under the name Viton. As an added feature, the seal cartridge 100 is formed so that it can be disassembled to allow replacement of the bushing 130 or gasket 140. Although the seal cartridges are shown as being disposed at both ends of the the drive shaft 65, the seals in the lower support member 190 may be formed as unitary UHMW bushings.

The gear mechanism 95 includes a first gear 145 connected to the first drive shaft 65, a sprocket 150 connected to the first drive shaft 65, and a second gear 155 connected to the second drive shaft 70. The gears may be formed from polysafone while the sprocket may be formed from polypropylene or from a nylon compound such as the one commercially available from Polymer Corporation by the name of nylatron. The gears are dimensioned to have a 1:1 gearing ratio so that rotation of the first gear 145 and drive shaft 65 results in an equal counterrotation of the second gear 155 and drive shaft 70. The gears are secured to their respective drive shafts by set screw 160 disposed through the collars 165 of each gear. Each gear also includes a bushing 170 that is used to adapt the gear to the particular drive shaft diameter.

As illustrated, the sprocket 150 is connected to the first drive shaft 65 in the region above the first gear 145. The sprocket includes a spacer collar 175 which spaces the toothed portion 180 from the first gear 145 to prevent interference of the gear by a drive chain connected to the sprocket. The sprocket 150 further includes a connection collar 185 through which a set screw 190 is disposed to secure the sprocket 150 to the first drive shaft 65. Although the gear and sprocket are shown as two distinct structures, those of ordinary skill in the art will recognize that the gear and sprocket may be formed as a unitary structure.

FIGS. 3-6 show two alternate embodiments for the pinch rollers 110. The first embodiment, shown in FIGS. 3 and 4, includes a central disc portion 195 and a plurality of outwardly curved compliant arms 200. An aperture 205 is disposed through the center of the disc portion 195 and is dimensioned to frictionally engage the drive shafts 65 and 70 therein. The second embodiment, shown in FIGS. 5 and 6, is similar to the first embodiment except for the addition of a web of material 210 that interconnects the curved arms 200. In either embodiment, the pinch rollers may be made from a chlorosulphonated polyethylene such as those that are commercially available from DuPont under the name Hypalon, or one of a variety of fluoro elastomers such as are available from DuPont under the name Viton.

FIG. 7 is a side view of a conveyor system of a printed circuit board processor incorporating a plurality of the drive mechanisms shown in FIG. 1. The conveyor system includes a processing section 215 and transfer sections 220, 225. Although not illustrated in the drawings, the processing section 215 is generally enclosed within a housing to form a processing chamber area 230 in which the particular processing function, e.g. etching, stripping, cleaning, rinsing, etc, takes place. The drive rollers, the drive shafts, and the accompanying pinch rollers and molded discs are disposed within the processing chamber area 230 while the gear mechanisms 95 are disposed exterior to the processing chamber area. The gear mechanisms, thus, are not be subject to the processing chemicals used in the processing chamber.

A plurality of columns 235 support the top support member 85 and space it from the bottom support member 90. The columns are spaced from one another so as not to obstruct the travel path of the printed circuit boards.

As illustrated, a plurality of drive mechanisms are arranged serially along the direction of travel of the printed circuit board, generally denoted by arrow 240. The drive mechanisms are arranged in an alternating sequence. That is, when the conveyor system is viewed from the side, a first type drive roller 20 of one drive mechanism is next to a second type drive roller 25 of a subsequent drive mechanism. Corresponding drive rollers of the opposite type are disposed on the opposite side of the machine to form the guide grooves through which the printed circuit board will travel. Squeegee rollers 245 having cooperating drive rollers are disposed at the entrance portion 250 and exit portion 255 of the processing section 215. Gripper blocks 260, such as are shown and described in U.S. Pat. No. 4,739,780 to Czaja, et. al., are used in the transfer sections 220 and 225.

Snap-on guide wires 265 are staggered along the length of the processing section to connect the drive shafts of adjacent drive mechanisms. One embodiment of such a guide wire 265 is shown in FIGS. 9 and 10. The guide wire 265 is formed from a material such as stainless steel, titanium, or a nickel based acid an resistant alloy such as available under the commercial name Hastelloy. The guide wire 265 includes two oppositely directed hook sections 270 and 275 which snap on to the respective drive shaft. The hook sections 270, 275 are joined together by a rod section 280. As shown in FIG. 1, the guide wires 265 on opposite sides of the processing portion are arranged to extend toward one another so that the rod sections 280 may, if necessary, act as supports for the printed circuit boards.

With reference to both FIGS. 7 and 8, the conveyor system is driven by a dry chain drive that is powered by a single motor 285. The motor's torque is supplied to a chain 287 which drives the gripping blocks 260 of the transfer section 220 through a 90 degree drive conversion box 290, the details of which are not pertinent to the invention and can be easily ascertained by a person of ordinary skill in the art. Alternatively, the motor 285 can be oriented to directly or indirectly drive the chain 287 without the need for the 90 degree conversion box. The motor's torque is also supplied through the 90 degree drive conversion box 290 to drive a main drive shaft 295 that extends vertically through the top support member 85 where it engages a sprocket 300. A conversion chain 305 extends between the sprocket 300 and the lower sprocket of a double sprocket structure 310. A main drive chain 315 extends from the upper sprocket of the double sprocket structure 310 and engages the sprockets 150 of the gear mechanisms 95. The main drive chain 315 also engages the upper sprocket of a further double sprocket structure 320. A further conversion chain 323 extends between a sprocket 325 and the lower sprocket of the double sprocket structure 320. The sprocket 325 is connected to an auxiliary drive shaft 330 which supplies the motor's torque to a chain 335 which drives the gripping blocks 260 of the transfer section 225 through a 90 degree drive conversion box 340.

In operation, printed circuit boards are transferred into the processing section 215 on the gripper blocks 260 of the transfer section 225. The rotating drive rollers at the input of the processing section lift and grip the printed circuit board and begin driving the printed circuit board in the direction denoted by arrow 240. Each pair of drive rollers urges the printed circuit board to a subsequent pair of drive rollers, gripping the printed circuit board at varying areas along the bottom portion thereof as it does so to allow complete processing of the printed circuit board. As the printed circuit board leaves the processing section 215, it is gripped by the gripping blocks 260 of the transfer section 220. From the transfer section 220, the printed circuit boards may be driven to subsequent processing chambers or units.

While only a single embodiment of the invention has been described hereinabove, those of ordinary skill in the art will recognize that the embodiment may be modified and altered without departing from the central spirit and scope of the invention. Thus, the preferred embodiment described hereinabove is to be considered in all respects as illustrative and not restrictive, the scope of the invention being indicated by the appended claims rather than by the foregoing description. Therefore, it is the intention of the inventor to embrace herein all such changes, alterations and modifications which come within the meaning and range of equivalency of the claims.

What is claimed is:

1. A drive mechanism for a conveyor of a printed circuit board processor comprising:
    a first roller mounted for rotation about a first axis, said first roller having an annular shaped portion with a generally outwardly slanted outer wall; and
    a second roller mounted for rotation about a second axis that is generally parallel to said first axis, said second roller having an annular shaped portion with a generally outwardly slanted outer wall, said outer wall of said annular shaped portion of said second roller and said outer wall of said annular shaped portion of said first roller defining a generally V-shaped guide groove in which a printed circuit board may be gripped by said first and second rollers, said second roller further having a flange extending toward said first roller proximate an underside of said slanted outer wall of said first roller thereby to assist in supporting and transporting printed circuit boards which are too thin for transport within said generally V-shaped guide groove, rotation of said first and second rollers driving said printed circuit board through said guide groove.

2. A drive mechanism as claimed in claim 1 wherein said first and second rollers engage one another so that rotation of said first roller about said first axis results in counterrotation of said second roller about said second axis.

3. A drive mechanism as claimed in claim 1 wherein said flange frictionally engages said first roller so that rotation of said first roller about said first axis results in counterrotation of said second roller about said second axis.

4. A drive mechanism for a conveyor of a printed circuit board processor comprising:
    a first roller having an annular shaped portion with a generally outwardly slanted outer wall;
    a first drive shaft extending axially into said first roller and defining a first axis of rotation;
    a second roller disposed adjacent said first roller, said second roller having an annular shaped portion with a generally outwardly slanted outer wall, said outer wall of said annular shaped portion of said second roller and said outer wall of said annular shaped portion of said first roller defining a generally V-shaped guide groove in which a printed circuit board may be gripped by said first and second rollers, said second roller further having a flange extending toward said first roller proximate an underside of said slanted outer wall of said first roller thereby to assist in supporting and transporting printed circuit boards which are too thin for transport within said generally V-shaped guide groove;

a second drive shaft extending axially into said second roller and defining a second axis of rotation, said second axis of rotation being generally parallel to said first axis of rotation, rotation of said first and second rollers driving said printed circuit board through said generally V-shaped guide groove.

5. A drive mechanism as claimed in claim 4 wherein said first and second rollers engage one another so that rotation of said first roller about said first axis results in counterrotation of said second roller about said second axis.

6. A drive mechanism as claimed in claim 4 wherein said flange frictionally engages said first roller so that rotation of said first roller about said first axis results in counterrotation of said second roller about said axis.

7. A drive mechanism as claimed in claim 4 and further comprising:

a first annular pinch roller having a plurality of compliant arms extending from a central disc portion, said central disc portion having an aperture accepting said first drive shaft; and a second annular pinch roller having a plurality of compliant arms extending from a central disc portion said central disc portion having an aperture accepting said second drive shaft, said first and second pinch rollers being aligned to grip said printed circuit board therebetween.

8. A drive mechanism as claimed in claim 4 and further comprising means for rotating said first and second rollers in a counterrotating fashion to drive said printed circuit board through said guide groove.

9. A drive mechanism as claimed in claim 8 wherein said means for rotating comprises:

a first gear disposed on said first drive shaft;

a sprocket disposed on said first drive shaft;

a second gear disposed on said second drive shaft, said first gear being meshed with said second gear.

10. A drive mechanism as claimed in claim 8 wherein said first and second rollers are disposed inside a chamber area, said first and second drive shafts also being disposed substantially inside said chamber area and extending exterior to said chamber area, said means for rotating being disposed exterior to said chamber.

11. A conveyor for a printed circuit board processor comprising:

a plurality of individual drive mechanisms disposed along and defining a printed circuit board path, each drive mechanism including:

a first roller having an annular shaped portion with a generally outwardly slanted outer wall, a first drive shaft extending axially into said first roller and defining a first axis of rotation, a second roller disposed adjacent said first roller, said second roller having an annular shaped portion with a generally outwardly slanted outer wall, said outer wall of said annular shaped portion of said second roller and said outer wall of said annular shaped portion of said first roller defining a generally V-shaped guide groove in which a printed circuit board may be gripped by said first and second rollers, said second roller further having a flange extending toward said first roller proximate an underside of said slanted outer wall of said first roller thereby to assist in supporting and transporting printed circuit boards which are too thin for transport within said generally V-shaped guide groove, a second drive shaft extending axially into said second roller and defining a second axis of rotation, said second axis of rotation being generally parallel to said first axis of rotation, rotation of said first and second rollers driving said printed circuit board through said guide groove; and means for rotating said first and second rollers in a counterrotating fashion to drive said printed circuit board through said guide groove.

12. A conveyor as claimed in claim 11 wherein said first and second rollers engage one another so that rotation of said first roller about said first axis results in counterrotation of said second roller about said second axis.

13. A conveyor as claimed in claim 12 wherein said flange frictionally engages said first roller so that rotation of said first roller about said first axis results in counterrotation of said second roller about said second axis.

* * * * *